(12) United States Patent
Lin et al.

(10) Patent No.: US 8,164,113 B2
(45) Date of Patent: Apr. 24, 2012

(54) ELECTROSTATIC DISCHARGE STRUCTURE FOR 3-DIMENSIONAL INTEGRATED CIRCUIT THROUGH-SILICON VIA DEVICE

(75) Inventors: Chih-Sheng Lin, Tainan County (TW); Chih-Wen Hsiao, Hsinchu County (TW); Keng-Li Su, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 414 days.

(21) Appl. No.: 12/564,051

(22) Filed: Sep. 22, 2009

(65) Prior Publication Data

US 2010/0237386 A1     Sep. 23, 2010

(30) Foreign Application Priority Data

Mar. 20, 2009  (TW) ............................... 98109183 A

(51) Int. Cl.
*H01L 23/60*     (2006.01)
*H01L 29/74*     (2006.01)
*H01L 31/111*    (2006.01)
*H01L 23/62*     (2006.01)
*H01L 23/48*     (2006.01)
*H02H 9/00*      (2006.01)

(52) U.S. Cl. . 257/173; 257/355; 257/774; 257/E27.026; 257/E23.011; 361/56

(58) Field of Classification Search .................. 257/173, 257/355, 774, E23.011, E27.026, E23.141; 361/56
See application file for complete search history.

(56) References Cited

U.S. PATENT DOCUMENTS

| 5,591,661 A | 1/1997 | Shiota |
| 5,591,992 A | 1/1997 | Leach |
| 2008/0296697 A1* | 12/2008 | Hsu et al. ...................... 257/379 |

* cited by examiner

*Primary Examiner* — David S Blum
(74) *Attorney, Agent, or Firm* — Jianq Chyun IP Office

(57) ABSTRACT

An electrostatic discharge (ESD) structure for a 3-dimensional (3D) integrated circuit (IC) through-silicon via (TSV) device is provided. The ESD structure includes a substrate, a TSV device which is formed through the substrate and is equivalent to a resistance-inductance-capacitance (RLC) device, and at least one ESD device which is disposed in the substrate and electrically connected to one end of the TSV device. The ESD structure can protect the 3D IC TSV device.

27 Claims, 8 Drawing Sheets

ELECTROSTATIC DISCHARGE STRUCTURE FOR 3-DIMENSIONAL INTEGRATED CIRCUIT THROUGH-SILICON VIA DEVICE

CROSS-REFERENCE TO RELATED APPLICATION

This application claims the priority benefit of Taiwan application serial no. 98109183, filed on Mar. 20, 2009. The entirety of the above-mentioned patent application is hereby incorporated by reference herein and made a part of specification.

BACKGROUND

1. Technical Field

The disclosure relates to an electrostatic discharge (ESD) structure for a 3-dimensional (3D) integrated circuit (IC) through-silicon via (TSV) device.

2. Description of Related Art

In recent years, with the rapid development of semiconductor process and the increase in the complexity of IC design and the demand to circuit performance, the integration of 3D IC has been developed so that the lengths of connecting wires and accordingly the RC delay can be reduced and circuit performance can be improved. Besides, different layers in the 3D IC can be fabricated through different techniques and then stacked together, so that the fabrication cost of the IC can be reduced.

Different chips are usually connected by a through-silicon via (TSV). This is a new technique in the 3D IC technology, wherein a vertical electrical connection completely passes through the chips or wafers to connect the same. Unlike the conventional IC packaging/bonding techniques and the conventional stacking technique by using bumps, this new TSV technique can maximize the stacked density of chips in 3 directions and minimize the size of the IC, and meanwhile, this technique can also increase the speed and reduce the signal delay and power consumption of the IC. Thereby, the TSV technique has become one of the most focused techniques in today's 3D IC technology.

However, because a 3D IC is composed of stacked chips, each chip has different fabrication technique and power supply, and these chips are connected through a TSV device, when the TSV device receives a high-voltage electrostatic or noise (for example, the electrostatic produced by a human-body model (HBM), a machine model (MM), a charged-device model (CDM), or a field-induced model (FIM)), the electrostatic can run to all the stacked chips through the TSV device, and thus the 3D IC or the TSV device may be damaged.

SUMMARY

Accordingly, the disclosure is directed to an electrostatic discharge (ESD) structure for a 3-dimensional (3D) integrated circuit (IC) through-silicon via (TSV) device, wherein a TSV device is integrated with the ESD structure such that the 3D IC TSV device can be protected from ESD and the chip area thereof can be effectively reduced.

The disclosure provides an ESD structure for a 3D IC TSV device, wherein the ESD structure includes a substrate, a TSV device, and at least one ESD device. The TSV device is formed through the substrate and is equivalent to a resistance-inductance-capacitance (RLC) device. The ESD device is disposed in the substrate and electrically connected to one end of the TSV device.

As described above, the disclosure provides an ESD structure for a 3D IC TSV device, wherein an ESD device is integrated with a 3D IC TSV device such that an ESD protection mechanism is provided between chips and a TSV device. The ESD structure provided by the disclosure is very simple and can be fabricated around the TSV device so that the chip area can be effectively reduced.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

Figure 1:
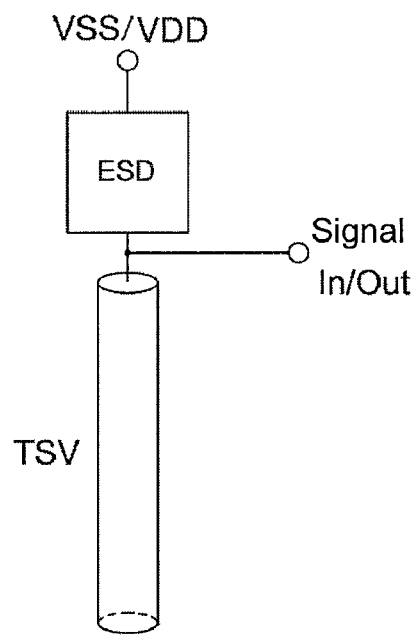
FIG. 1 is a circuit diagram of an electrostatic discharge (ESD) structure for a 3-dimensional (3D) integrated circuit (IC) through-silicon via (TSV) device according to the disclosure.

Reference will now be made in detail to the embodiments of the disclosure, examples of which are illustrated in the accompanying drawings. Wherever possible, the same reference numbers are used in the drawings and the description to refer to the same or like parts.

According to the disclosure, a 3-dimensional (3D) integrated circuit (IC) through-silicon via (TSV) device is integrated with an electrostatic discharge (ESD) device so that the 3D IC TSV device can be protected from ESD. FIG. 1 is a circuit diagram of an ESD structure for a 3D IC TSV device according to the disclosure. Referring to FIG. 1, the ESD device is electrically connected to one end of a TSV device, wherein the TSV device is equivalent to a resistance-inductance-capacitance (RLC) device. The ESD device may also be connected to a VSS or VDD according to the actual requirement of circuit design. For example, assuming the ESD device to be a semiconductor junction diode, if an ESD current having a positive voltage runs from a Signal In/Out terminal to the TSV device, the original reverse-biased diode (i.e., ESD device) becomes forward-biased, and accordingly a discharge path is produced such that the ESD current is conducted away; and vice versa. Generally, when the circuit operates normally, the ESD device is not activated therefore won't affect the operation of the circuit.

Below, embodiments of the disclosure will be described in detail with reference to accompanying drawings. However, these embodiments are not intended to limiting the scope of the disclosure, and the disclosure can be implemented in many different ways. In fact, these embodiments are described herein in order to allow those having ordinary knowledge in the art to better understand the spirit of the disclosure. In the accompanying drawings, the sizes of different layers and areas are exaggeratedly illustrated for easy understanding. To simplify the description, only structures or devices related to the disclosure are illustrated in the drawings. Those devices on the substrate which are not illustrated are well-known to those having ordinary knowledge in the art, and therefore can be disposed according to the actual requirement for 3D IC.

Various terms used in following description are only used for describing the embodiments of the disclosure but not for limiting the scope thereof. Except explicitly stated, the articles "a" and "the" also refer to plural forms, and the terms such as "first" and "second" are only used for distinguishing a device, area, or layer from another device, area or layer. For example, a first region mentioned below may also be referred to as a second region without departing the scope and spirit of the disclosure.

In addition, terms referring to spatial relations such as "below . . . ", "above . . . ", "lower", and "upper" may be used in the disclosure for describing the relationship between one and another element in the accompanying drawings. It should be understood that such terms cover different spatial positions other than those illustrated in accompanying drawings. For example, if an element is reversed, this element which is originally "below" or "under" another element is now described as "above" or "on" the other element. Namely, the term "below . . . " refer to both being below and on an element.

Figure 2A:
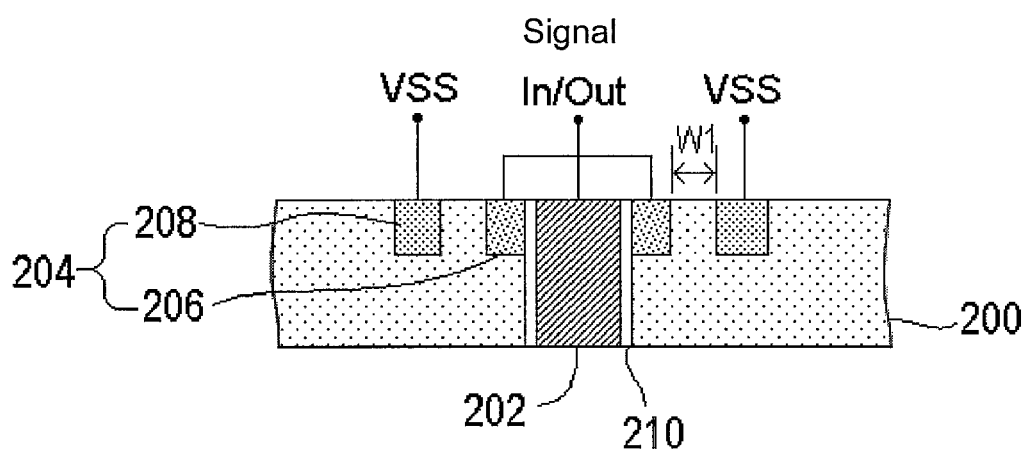
FIG. 2A and FIG. 2B are cross-sectional views of two different ESD structures for a 3D IC TSV device according to a first embodiment of the disclosure.
Figure 2B:
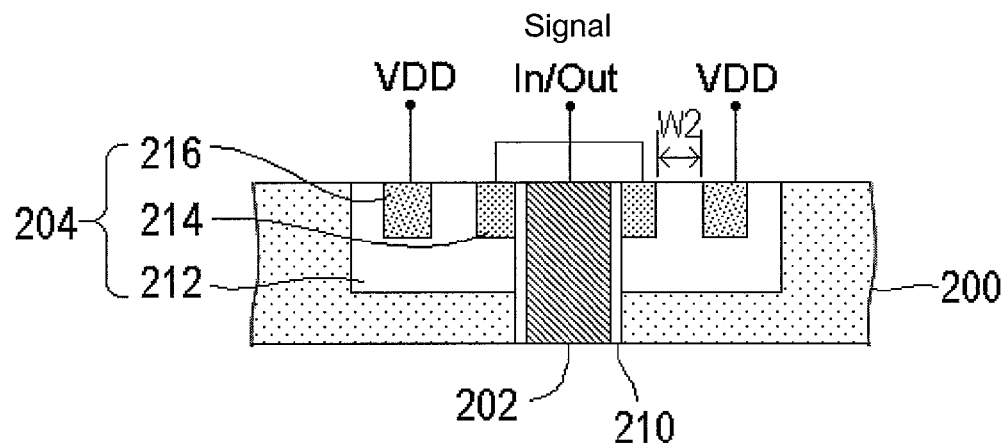

FIG. 2A and FIG. 2B are cross-sectional views of two different ESD structures for a 3D IC TSV device according to a first embodiment of the disclosure.

Referring to FIG. 2A first, in the present embodiment, the ESD structure includes a single substrate 200, a TSV device 202, and an ESD device 204. If the substrate 200 is a p-type substrate (such as a silicon substrate), the ESD device 204 is composed of an N+ region 206 which completely or partially surrounds the TSV device 202 and a P+ region 208 which completely or partially surrounds the N+ region 206, wherein a distance W1 is kept between the P+ region 208 and the N+ region 206. However, the disclosure is not limited thereto. If the substrate 200 is an N-sub, foregoing structure may also be implemented by simply exchanging the positions of the N+ region and the P+ region in the ESD device 204. In the present embodiment, "partially surrounding" means that the doped region only surrounds part of the TSV device 202 and has two unconnected ends, such as a C or N shape. However, the disclosure is not limited thereto. The ESD device 204 may also be located at a single side or both sides of the TSV device 202, and it is within the scope of the disclosure as long as the ESD device 204 is a PN junction.

Referring to FIG. 2A again, because the area of the PN junction in the ESD device 204 may affect the intensity of the protection circuit, the greater the distance W1 is, the larger the area of the PN junction is and accordingly the greater current the ESD device 204 can accept. The N+ region 206 of the ESD device 204 is electrically connected to one end of the TSV device 202 and also connected to a Signal In/Out terminal. The P+ region 208 of the ESD device 204 is usually connected to the VSS. Besides, an insulating layer 210 may be disposed between the substrate 200 and the TSV device 202 for insulating the TSV device 202 and the substrate 200.

Referring to FIG. 2B, to connect the ESD device 204 to the VDD, the ESD device 204 may be composed of an N-well 212, a P+ region 214, and an N+ region 216 when the substrate 200 is a p-type substrate, wherein the N-well 212 completely or partially surrounds the TSV device 202, the P+ region 214 is located in the N-well 212 and completely or partially surrounds the TSV device 202, the N+ region 216 is located in the N-well 212 and completely or partially surrounds the P+ region 214, and a distance W2 is kept between the N+ region 216 and the P+ region 214. However, the disclosure is not limited thereto. If the substrate 200 is an N-substrate, foregoing structure may also be implemented by simply changing the N-well of the ESD device 204 to a P-well and exchanging the positions of the N+ region and the P+ region. As described above, the "partially surrounding" herein also means that the doped region only surrounds part of the TSV device 202 and has two unconnected ends. According to the disclosure, the ESD device 204 may also be disposed at a single side or both sides of the TSV device 202. Besides, the greater the distance W2 is, the greater the area of the PN junction is, and accordingly the greater current the ESD device 204 can accept. The P+ region 214 is electrically connected to one end of the TSV device 202 and also connected to a Signal In/Out terminal, and the N+ region 216 of the ESD device 204 is connected to the VDD.

The layout of the ESD device 204 is not limited to that illustrated in FIGS. 2A and 2B. However, such a layout is suitable for being formed in a 3D IC for effectively protecting the TSV device and is easy to be integrated with a TSV. Such an ESD structure has another feature compared to the conventional ESD device implemented with a metal-oxide semiconductor field-effect transistor (MOSFET), which is, when a TSV is fabricated, to prevent the MOSFET from being damaged, no MOSFET can be fabricated within a certain range around the TSV. Namely, the space around the TSV is wasted. However, the ESD structure in the disclosure can fully utilize this space besides providing the ESD protection function.

Figure 3:
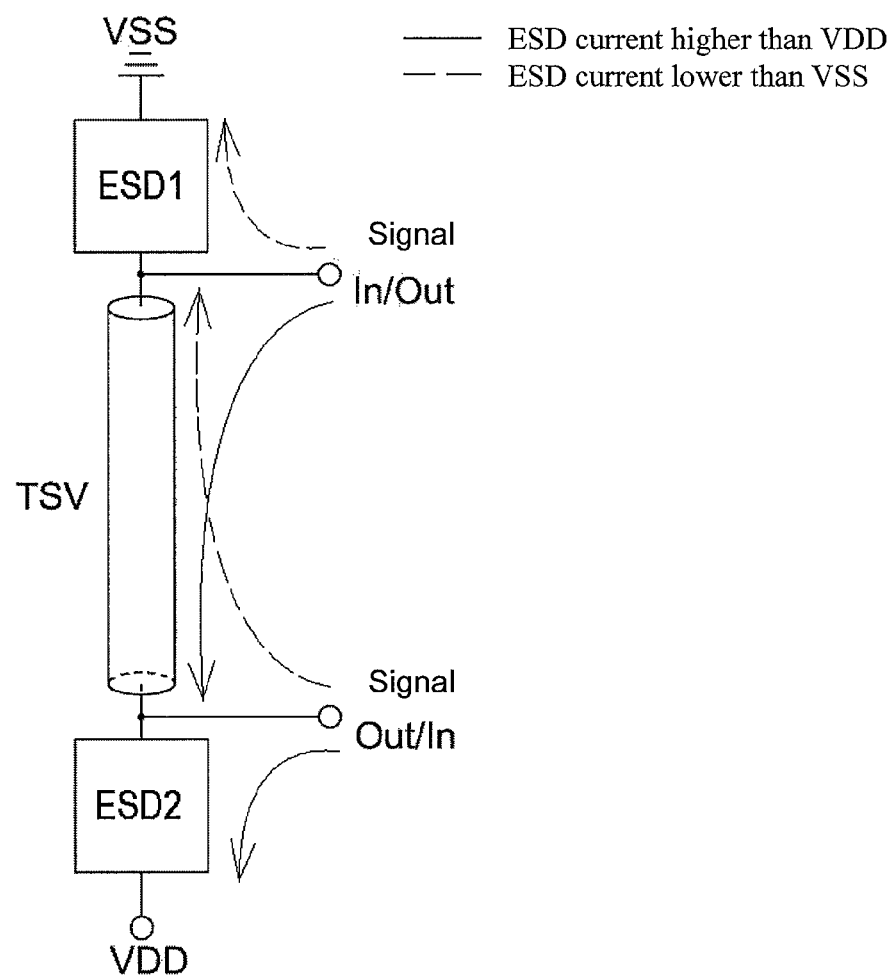
FIG. 3 is a circuit diagram of another ESD structure for a 3D IC TSV device according to the disclosure.

Based on the embodiment described above, the ESD structure in the disclosure for a 3D IC TSV device can be further developed into having two ESD devices electrically connected to two ends of the TSV device respectively, as shown in FIG. 3. Referring to FIG. 3, the ESD devices are electrically connected to the two ends of the TSV device respectively, one ESD device ESD1 is further connected to the VSS, and the other ESD device ESD2 is further connected to the VDD. Accordingly, when an ESD current higher than the VDD runs through the TSV device, the ESD device ESD2 is forward-biased therefore conducts away the ESD current. Contrarily, if an ESD current lower than the VSS runs through the TSV device, the ESD device ESD1 is forward-biased therefore conducts away the ESD current. As a result, the ESD current is prevented from damaging the circuit through the TSV, and the TSV device itself is also protected.

Figure 4:
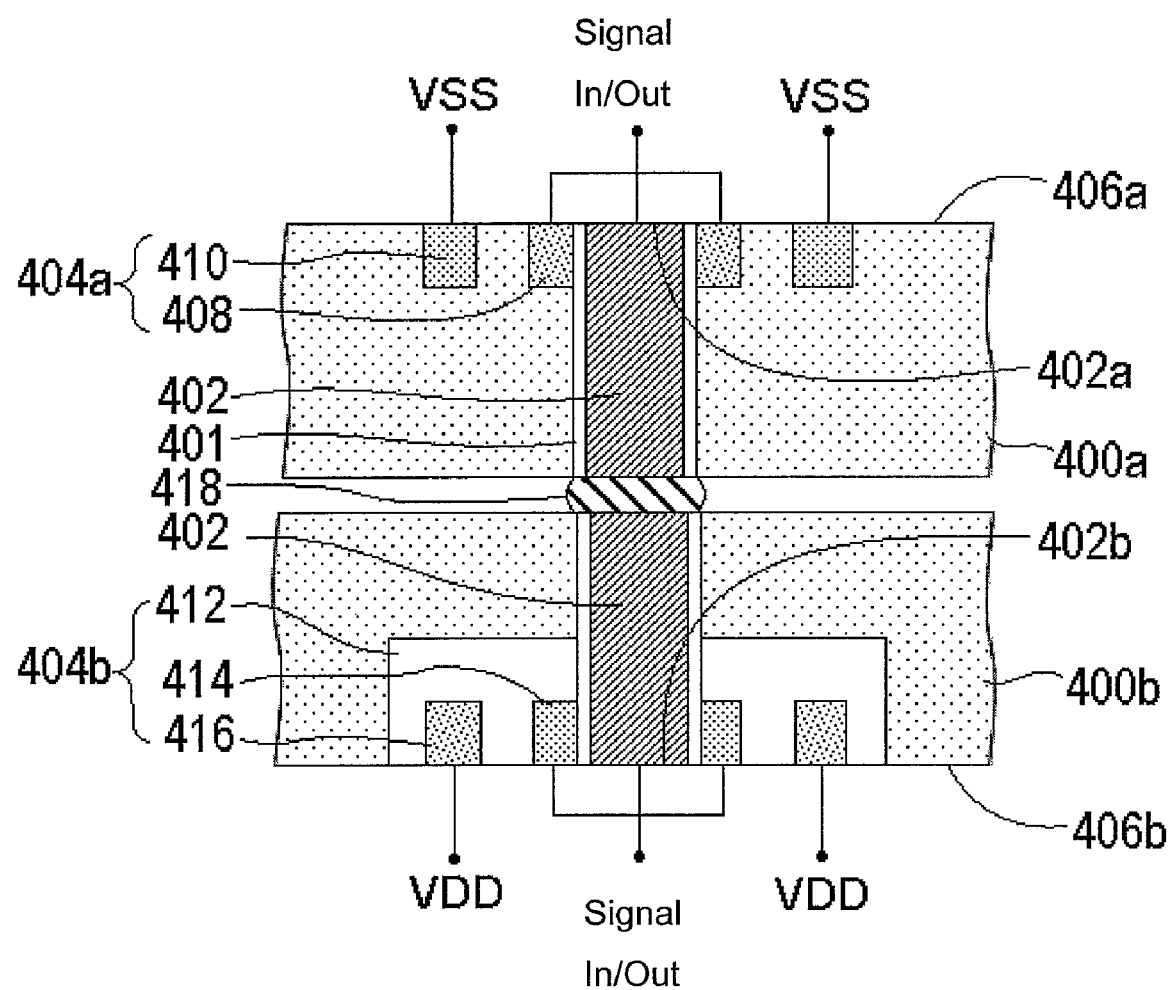
FIG. 4 is a cross-sectional view of an ESD structure for a 3D IC TSV device according to a second embodiment of the disclosure.

FIG. 4 is a cross-sectional view of an ESD structure for a 3D IC TSV device according to a second embodiment of the disclosure.

Referring to FIG. 4, in the present embodiment, the ESD structure includes an upper substrate 400a, a lower substrate 400b, a TSV device 402, and two ESD devices 404a and 404b. The end 402a of the TSV device 402 is located on the upper surface 406a of the upper substrate 400a, and the other end 402b of the TSV device 402 is located on the lower surface 406b of the lower substrate 400b. Generally, an insulating layer 401 is further disposed between the TSV device 402 and the upper substrate 400a and the lower substrate

400b. The two ESD devices 404a and 404b are respectively located on the upper surface 406a of the upper substrate 400a and the lower surface 406b of the lower substrate 400b. If the upper substrate 400a and the lower substrate 400b are both p-type substrates, the ESD device 404a located on the upper surface 406a of the upper substrate 400a includes an N+ region 408 which completely or partially surrounds the TSV device 402 and a P+ region 410 which completely or partially surrounds the N+ region 408, wherein a distance is kept between the N+ region 408 and the P+ region 410. The ESD device 404b located on the lower surface 406b of the lower substrate 400b includes an N-well 412 which completely or partially surrounds the TSV device 402b, a P+ region 414 which is in the N-well 412 and completely or partially surrounds the TSV device 402, and an N+ region 416 which is in the N-well 412 and completely or partially surrounds the P+ region 414, wherein a distance is kept between the P+ region 414 and the N+ region 416.

Referring to FIG. 4 again, the upper substrate 400a and the lower substrate 400b herein merely refer to two substrates having relative position in the space. In the current 3D IC technology, the TSV device 402 is respectively formed in the upper substrate 400a and the lower substrate 400b. Thus, after all the essential elements have been formed on a single substrate, as shown in FIG. 4, the TSV devices 402 on the upper substrate 400a and the lower substrate 400b can be connected through an interposer 418 (for example, bumps), and herein the TSV devices 402 located on the upper substrate 400a and the lower substrate 400b are considered as a single TSV device. According to existing 3D IC fabrication techniques, one or more substrates may be further disposed between the upper substrate 400a and the lower substrate 400b.

Figure 5A:
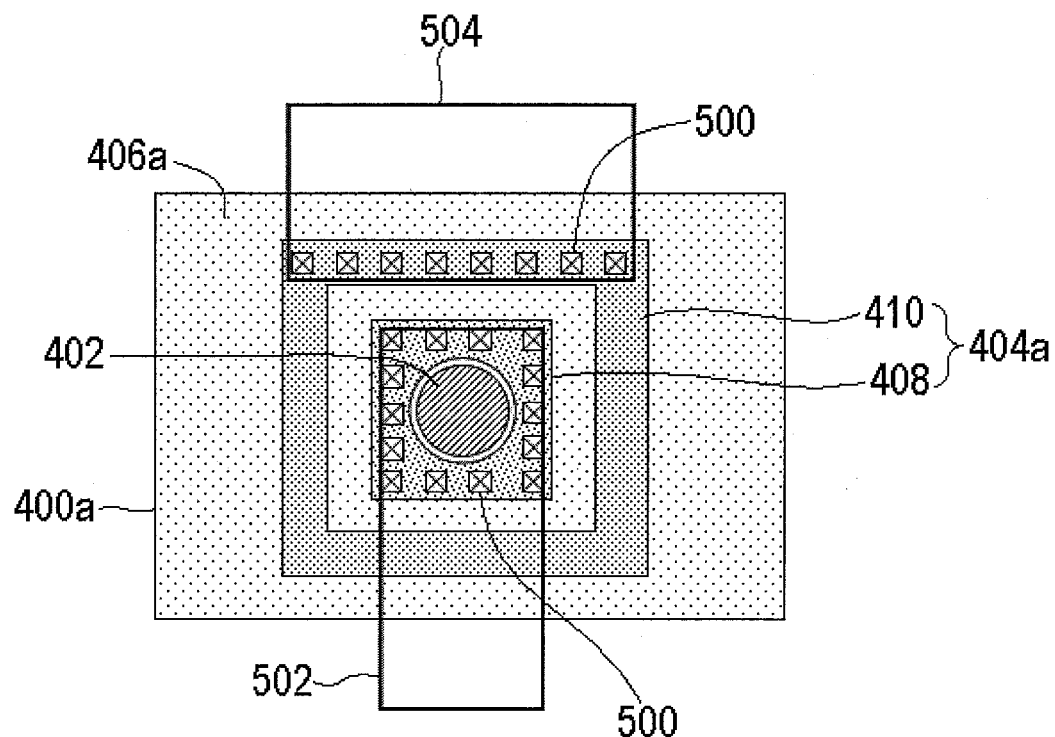
FIG. 5A and FIG. 5B are respectively top views of an upper surface 406a of an upper substrate 400a and a lower surface 406b of a lower substrate 400b in FIG. 4.
Figure 5B:
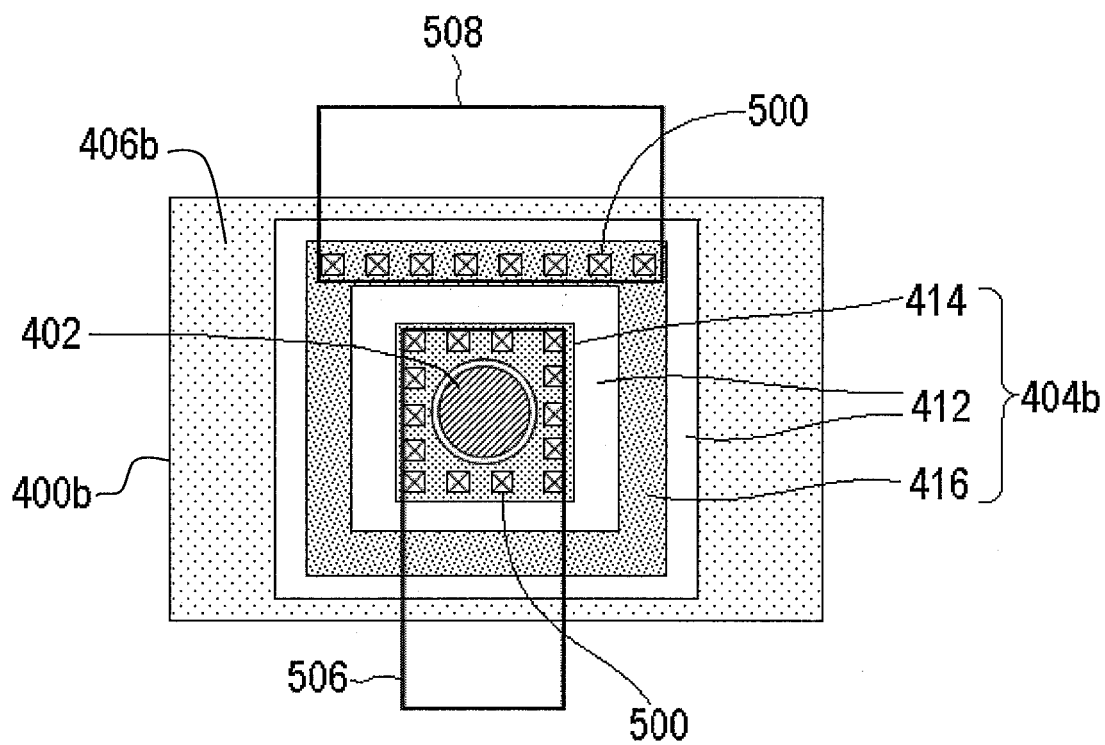

FIG. 5A and FIG. 5B are respectively top views of the upper surface 406a of the upper substrate 400a and the lower surface 406b of the lower substrate 400b in FIG. 4. Like reference numerals refer to like elements throughout FIGS. 5A and 5B and FIG. 4, and these elements will not be described herein. As shown in FIGS. 5A and 5B, both the N+ region 408 and the P+ region 410 of the ESD device 404a completely surround the TSV device 402, and the N-well 412, the P+ region 414, and the N+ region 416 of the ESD device 404b surround the TSV device 402.

Even though the P+ regions 410 and 414, the N+ regions 408 and 416, and the N-well 412 in the ESD devices 404a and 404b all a square profile in FIGS. 5A and 5B, the disclosure is not limited thereto. Namely, the profile of each doped region in an ESD device can be fabricated as a circular shape, an oval shape, or other suitable shapes according to the actual requirement of circuit design. Besides, the P+ regions and N+ regions of the two ESD devices 404a and 404b in FIGS. 5A and 5B may only partially surround the TSV or may also be disposed at one side or both sides of the TSV, and it is within the scope of the disclosure as long as the ESD devices are PN junctions.

Referring to FIG. 5A, the N+ region 408 of the ESD device 404a is electrically connected to one end of the TSV device 402 through a contact 500 and a conductive layer 502 on the upper surface 406a of the upper substrate 400a, and the conductive layer 502 may be further connected to a Signal In/Out terminal, and the P+ region 410 of the. ESD device 404a is connected to the VSS through the contact 500 and a conductive layer 504. Referring to FIG. 5B, the P+ region 414 of the ESD device 404b is electrically connected to one end of the TSV device 402 through the contact 500 and a conductive layer 506 on the lower surface 406b of the lower substrate 400b, and the conductive layer 506 may be further connected to the Signal In/Out terminal, and the N+ region 416 of the ESD device 404b is connected to the VDD through the contact 500 and a conductive layer 508.

Figure 6:
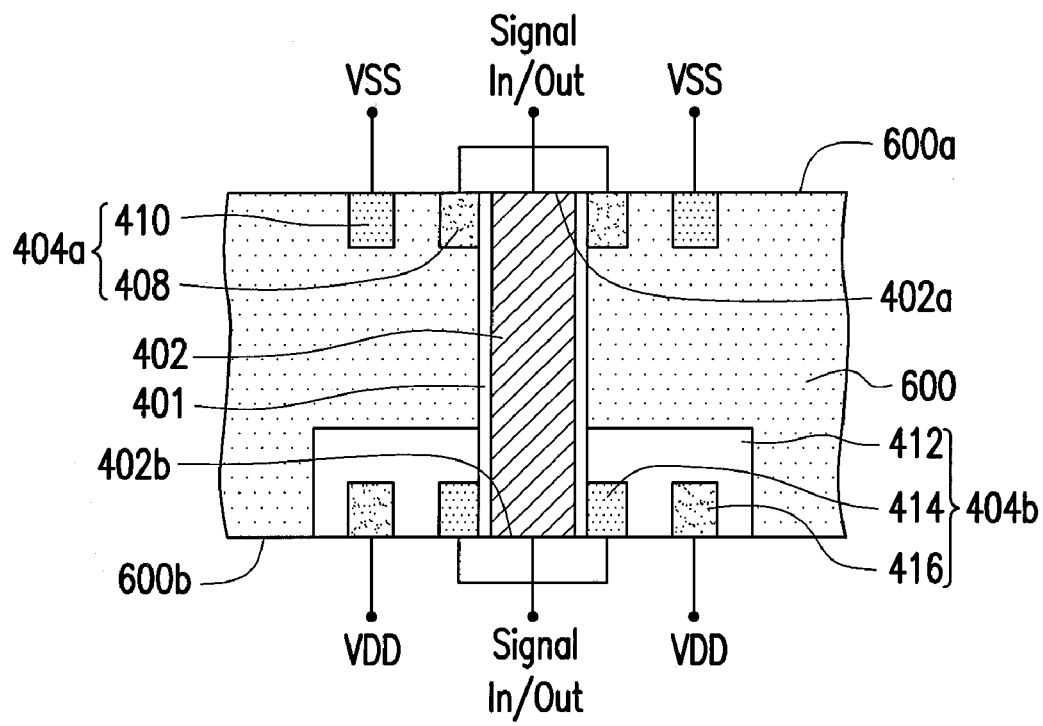
FIGS. 6-8 are respectively cross-sectional views of three different ESD structures for a 3D IC TSV device according to a third embodiment of the disclosure.
Figure 7:
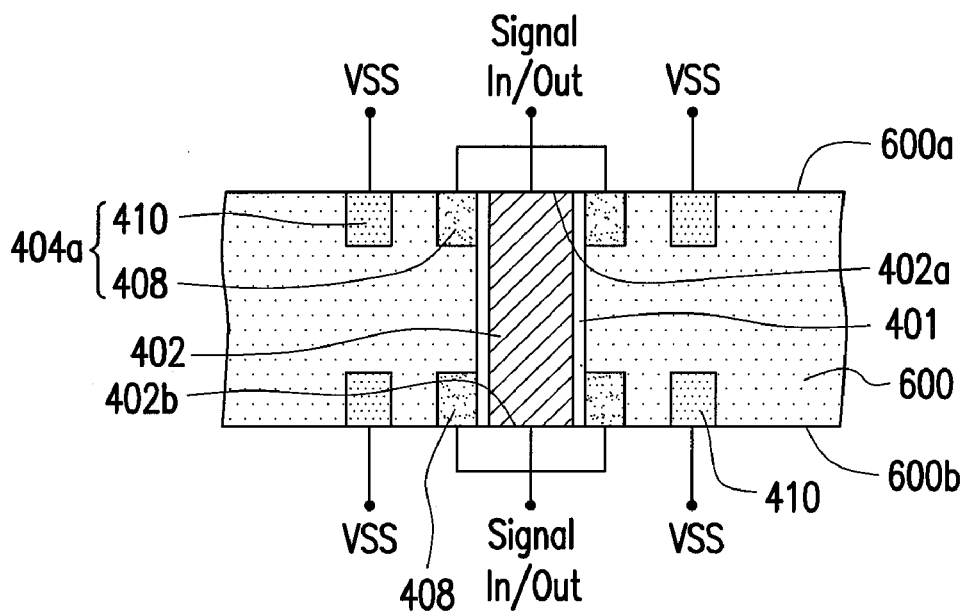
Figure 8:
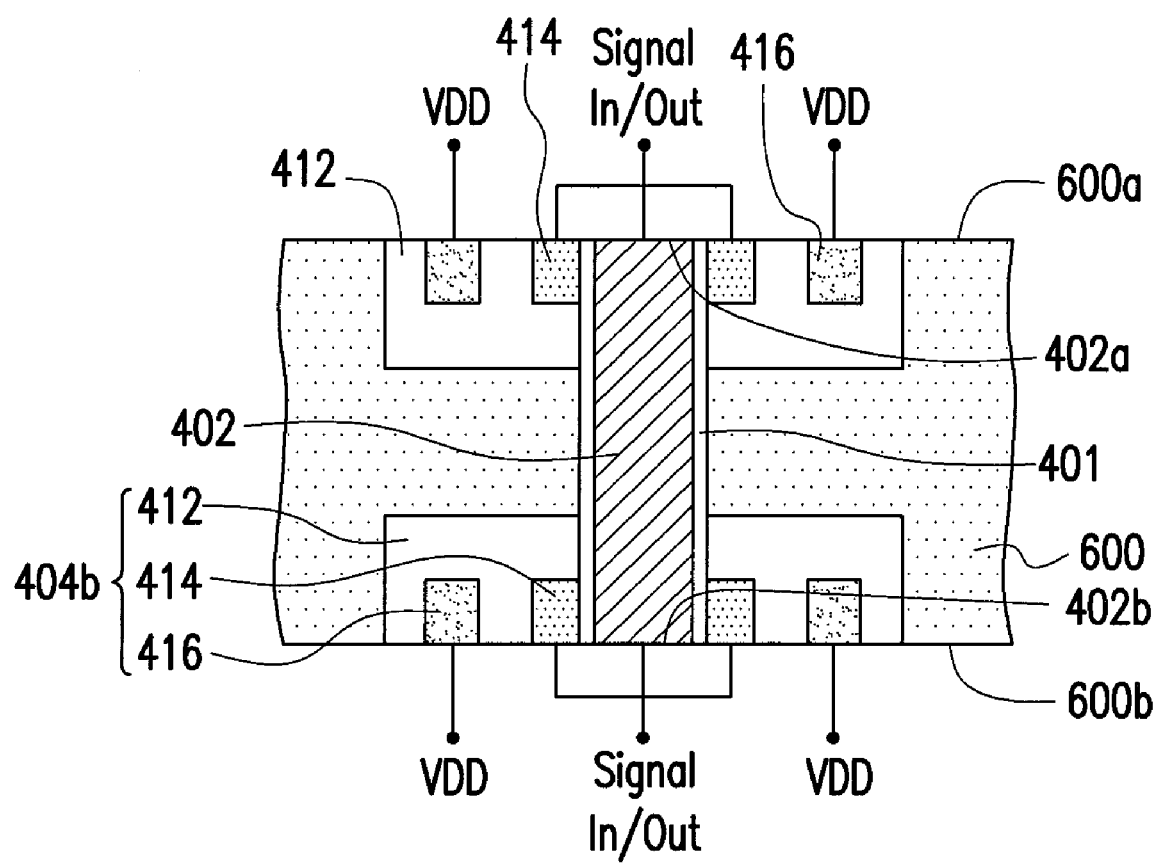

FIGS. 6-8 are respectively cross-sectional views of three different ESD structures for a 3D IC TSV device according to a third embodiment of the disclosure, wherein like reference numerals refer to like elements throughout FIGS. 6-8 and FIG. 4.

Referring to FIG. 6, the ESD structure includes a substrate 600, a TSV device 402, and two ESD devices 404a and 404b. The end 402a of the TSV device 402 is located on the upper surface 600a of the substrate 600, and the other end 402b of the TSV device 402 is located on the lower surface 600b of the substrate 600. An insulating layer 401 is usually disposed between the TSV device 402 and the substrate 600. The two ESD devices 404a and 404b are respectively located on the upper surface 600a and the lower surface 600b of the substrate 600.

Besides being different ESD devices 404a and 404b (as shown in FIG. 6), the ESD devices disposed on the upper surface 600a and the lower surface 600b may also be the same ESD devices 404a (as shown in FIG. 7) or the same ESD devices 404b (as shown in FIG. 8).

Figure 9:
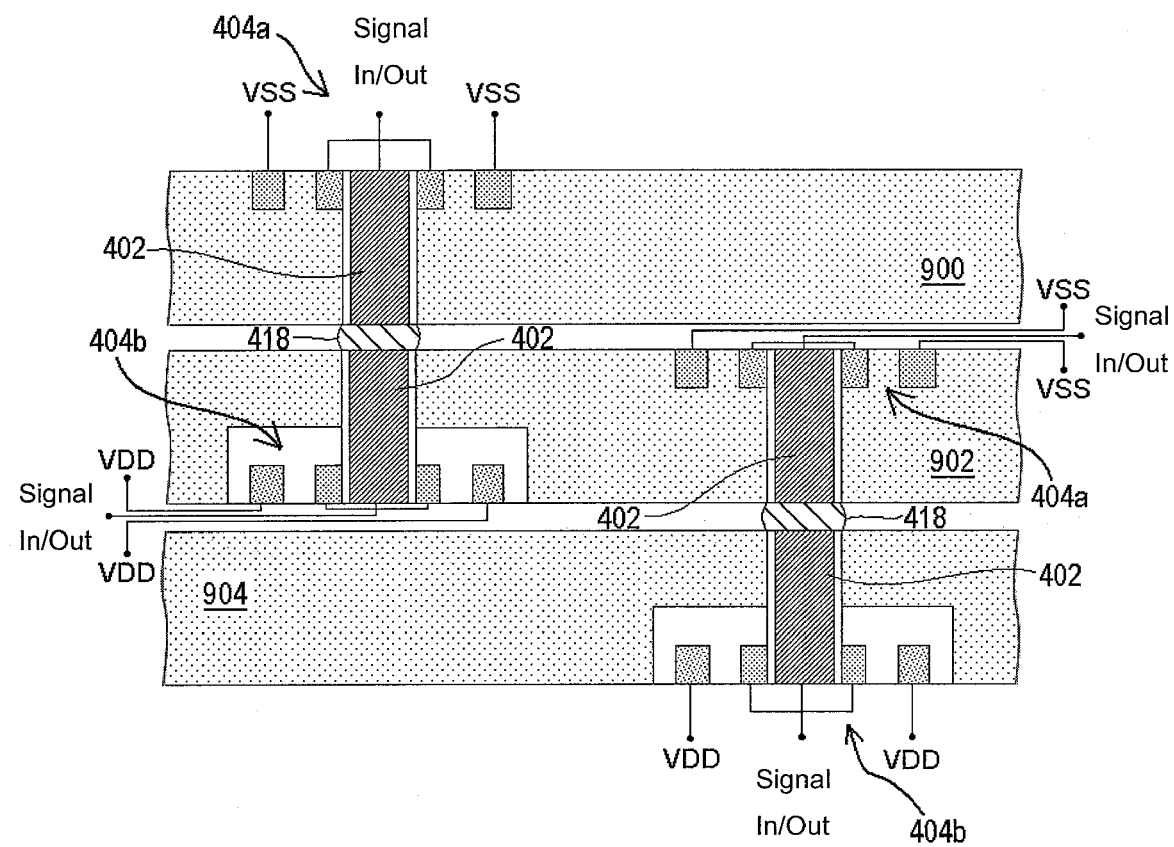
FIG. 9 is a cross-sectional view of an ESD structure for a 3D IC TSV device according to a fourth embodiment of the disclosure.

FIG. 9 is a cross-sectional view of an ESD structure for a 3D IC TSV device according to a fourth embodiment of the disclosure, wherein like reference numerals refer to like elements throughout FIG. 9 and FIG. 4.

Referring to FIG. 9, because a 3D IC usually includes multiple layers of substrates and multiple TSV devices may be disposed between the substrates, in the present embodiment, an ESD structure for 3D IC. TSV device composed of a TSV device 402 and ESD device 404a and/or ESD device 404b may be disposed in the substrates 900, 902, and 904 according to the actual requirement. However, the disclosure is not limited to the structure described in foregoing embodiment, and those having ordinary knowledge in the art may also integrate the technique provided by the disclosure according to the actual requirement and dispose an ESD device at any end of a stacked 3D IC.

Figure 10:
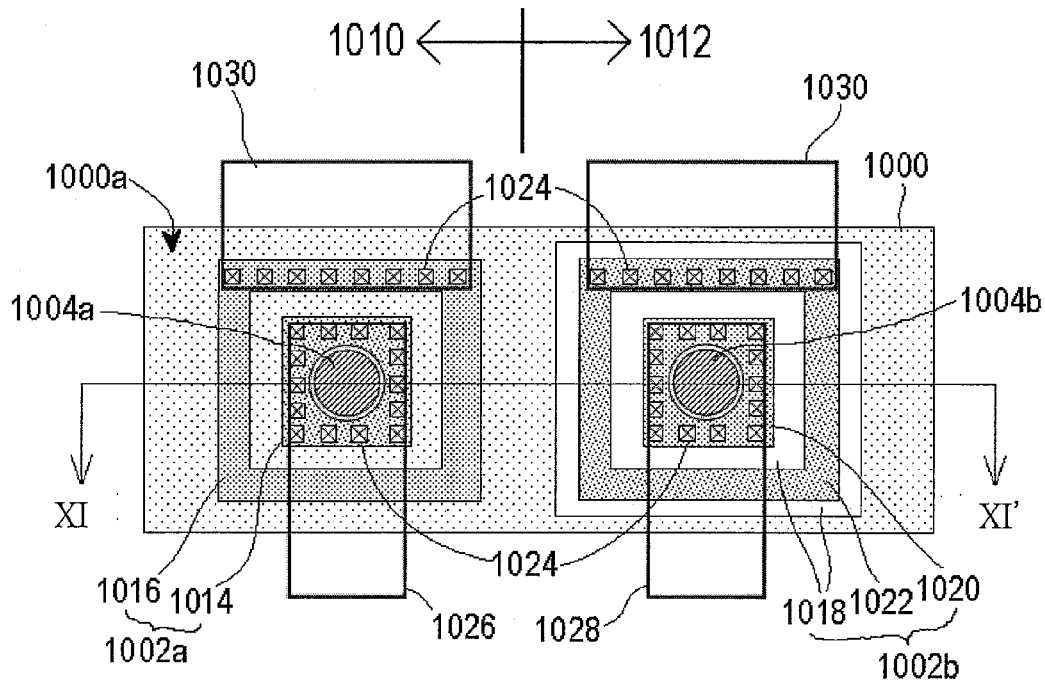
FIG. 10 is a top view of an ESD structure for a 3D IC TSV device according to a fifth embodiment of the disclosure.
Figure 11:
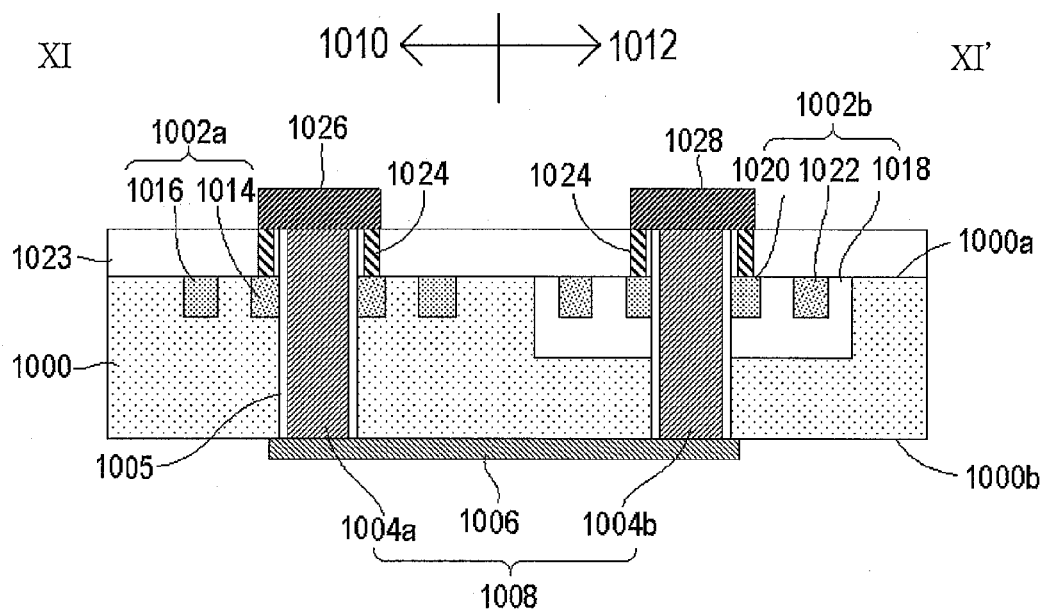
FIG. 11 is a cross-sectional view of the ESD structure in FIG. 10 along line XI-XI'.

FIG. 10 is a top view of an ESD structure for a 3D IC TSV device according to a fifth embodiment of the disclosure, and FIG. 11 is a cross-sectional view of the ESD structure in FIG. 10 along line XI-XI'.

Referring to both FIG. 10 and FIG. 11, in the present embodiment, the ESD structure for a 3D IC TSV device includes a substrate 1000, two ESD devices 1002a and 1002b, and a TSV device 1008, wherein the TSV device 1008 is composed of two TSVs 1004a and 1004b and a conductive line 1006. Even though only two TSVs 1004a and 1004b are illustrated in FIG. 10, the disclosure is not limited thereto. Namely, the substrate 1000 may have more TSVs. Referring to FIG. 10, the TSVs 1004a and 1004b are respectively located in a first region 1010 and a second region 1012 of the substrate 1000 and formed through the substrate 1000, and an insulating layer 1005 is disposed between the TSVs 1004a and 1004b and the substrate 1000. The ESD devices 1002a and 1002b are respectively located on the front side 1000a of the first region 1010 of the substrate 1000 and the front side 1000a of the second region 1012 of the substrate 1000. The conductive line 1006 is located on a back side 1000b of the substrate 1000 for connecting the two TSVs 1004a and 1004b. If the substrate 1000 is a p-type substrate, the ESD device 1002a includes an N+ region 1014 which completely surrounds the TSV 1004a in the first region 1010 and a P+ region 1016 which completely surrounds the N+ region 1014, wherein a distance is kept between the P+ region 1016 and the N+ region 1014. The ESD device 1002b includes an N-well 1018 which completely surrounds the TSV device 1004b in the second region 1012, a P+ region 1020 which is in the N-well 1018 and completely surrounds the TSV device 1004b, and an N+ region 1022 which is in the N-well 1018 and completely surrounds the P+ region 1020, wherein a distance is kept between the N+ region 1022 and the P+ region 1020.

Referring to FIG. 10 and FIG. 11, the N+ region 1014 of the ESD device 1002a is electrically connected to the TSV 1004a in the first region 1010 on the front side 1000a of the substrate 1000 through a contact 1024 formed on the dielectric layer 1023 and the conductive layer 1026. The P+ region 1020 of the ESD device 1002b is electrically connected to the TSV 1004b in the second region 1012 on the front side 1000a of the substrate 1000 through the contact 1024 and the conductive layer 1028. The P+ region 1016 of the ESD device 1002a and the N+ region 1022 of the ESD device 1002b are respectively connected to the VSS and the VDD through the contact 1024 and the conductive layer 1030.

As described above, the disclosure provides an ESD structure including a TSV device and at least one ESD device, wherein the ESD device is activated when an ESD current is higher than a VDD so that the 3D IC and the TSV device can be protected from ESD, and the space around the TSV device can be fully utilized. Thereby, the ESD structure in the disclosure can be integrated with a TSV device and the chip area can be reduced.

It will be apparent to those skilled in the art that various modifications and variations can be made to the structure of the disclosure without departing from the scope or spirit of the disclosure. In view of the foregoing, it is intended that the disclosure cover modifications and variations of this disclosure provided they fall within the scope of the following claims and their equivalents.

What is claimed is:

1. An electrostatic discharge (ESD) structure for a 3-dimensional (3D) integrated circuit (IC) through-silicon via (TSV) device, comprising:
    a substrate;
    a TSV device, formed through the substrate, wherein the TSV device is equivalent to a resistance-inductance-capacitance (RLC) device; and
    at least one ESD device, located in the substrate and electrically connected to one end of the TSV device.

2. The ESD structure according to claim 1, wherein the ESD device comprises a semiconductor junction diode.

3. The ESD structure according to claim 2, wherein the substrate comprises a p-type substrate, and the ESD device comprises:
    an N+ region, surrounding the TSV device; and
    a P+ region, surrounding the N+ region, wherein a distance is kept between the P+ region and the N+ region.

4. The ESD structure according to claim 3, wherein the N+ region of the ESD device is electrically connected to one end of the TSV device.

5. The ESD structure according to claim 2, wherein the substrate comprises a p-type substrate, and the ESD device comprises:
    N-well, surrounding the TSV device;
    a P+ region, located in the N-well, and surrounding the TSV device; and
    an N+ region, located in the N-well, and surrounding the P+ region, wherein a distance is kept between the N+ region and the P+ region.

6. The ESD structure according to claim 5, wherein the P+ region of the ESD device is electrically connected to one end of the TSV device.

7. The ESD structure according to claim 1, comprising two ESD devices, wherein the two ESD devices are electrically connected to each end of the TSV device respectively.

8. The ESD structure according to claim 7, wherein the substrate comprises an upper substrate and a lower substrate;
    one end of the TSV device is located on an upper surface of the upper substrate;
    another end of the TSV device is located on a lower surface of the lower substrate; and
    the two ESD devices are respectively located on the upper surface of the upper substrate and the lower surface of the lower substrate.

9. The ESD structure according to claim 8, wherein the two ESD devices at least comprise two semiconductor junction diodes.

10. The ESD structure according to claim 9, wherein the, upper substrate is a p-type substrate, and the ESD device located on the upper surface of the upper substrate comprises:
    an N+ region, surrounding the TSV device; and
    a P+ region, surrounding the N+ region, wherein a distance is kept between the P+ region and the N+ region.

11. The ESD structure according to claim 10, wherein the N+ region of the ESD device is electrically connected to the end of the TSV device located on the upper surface of the upper substrate.

12. The ESD structure according to claim 9, wherein the lower substrate is a p-type substrate, and the ESD device located on the lower surface of the lower substrate comprises:
    an N-well, surrounding the TSV device;
    a P+ region, located in the N-well, and surrounding the TSV device; and
    an N+ region, located in the N-well, and surrounding the P+ region, wherein a distance is kept between the N+ region and the P+ region.

13. The ESD structure according to claim 12, wherein the P+ region of the ESD device is electrically connected to the end of the TSV device located on the lower surface of the lower substrate.

14. The ESD structure according to claim 7, wherein the substrate comprises an upper surface and a lower surface;
    one end of the TSV device is located on the upper surface;
    another end of the TSV device is located on the lower surface; and
    the two ESD devices are respectively located on the upper surface and the lower surface.

15. The ESD structure according to claim 14, wherein the two ESD devices at least comprise two semiconductor junction diodes.

16. The ESD structure according to claim 15, wherein the substrate is a p-type substrate, and the ESD device located on the upper surface or the lower surface comprises:
    an N+ region, surrounding the TSV device; and
    a P+ region, surrounding the N+ region, wherein a distance is kept between the P+ region and the N+ region.

17. The ESD structure according to claim 16, wherein the N+ region of the ESD device is electrically connected to the end of the TSV device located on the upper surface.

18. The ESD structure according to claim 15, wherein the substrate is a p-type substrate, and the ESD device located on the upper surface or the lower surface comprises:
    an N-well, surrounding the TSV device;
    a P+ region, located in the N-well, and surrounding the TSV device; and
    an N+ region, located in the N-well, and surrounding the P+ region, wherein a distance is kept between the N+ region and the P+ region.

19. The ESD structure according to claim 18, wherein the P+ region of the ESD device is electrically connected to the end of the TSV device located on the lower surface.

20. The ESD structure according to claim 7, wherein the TSV device comprises:
  at least two TSVs, respectively located in a first region and a second region of the substrate and formed through the substrate; and
  a conductive line, located on a back side of the substrate for connecting the two TSVs; and
  the two ESD devices, respectively located on a front side of the first region of the substrate and a front side of the second region of the substrate.

21. The ESD structure according to claim 20, wherein the two ESD devices comprise two semiconductor junction diodes.

22. The ESD structure according to claim 21, wherein the substrate comprises a p-type substrate, and the ESD device located on the front side of the first region comprises:
  an N+ region, surrounding the TSV in the first region; and
  a P+ region, surrounding the N+ region, wherein a distance is kept between the P+ region and the N+ region.

23. The ESD structure according to claim 22, wherein the N+ region of the ESD device is electrically connected to the TSV in the first region on a front side of the substrate.

24. The ESD structure according to claim 21, wherein the substrate comprises a p-type substrate, and the ESD device located on the front side of the second region comprises:
  an N-well, surrounding the TSV in the second region;
  a P+ region, located in the N-well, and surrounding the TSV device in the second region; and
  an N+ region, located in the N-well, and surrounding the P+ region, wherein a distance is kept between the N+ region and the P+ region.

25. The ESD structure according to claim 24, wherein the P+ region of the ESD device is electrically connected to the TSV in the second region on the front side of the substrate.

26. The ESD structure according to claim 1, wherein the substrate comprises a silicon substrate.

27. The ESD structure according to claim 1, further comprising an insulating layer disposed between the substrate and the TSV device.

* * * * *